United States Patent [19]

Nied

[11] Patent Number: 4,776,298
[45] Date of Patent: Oct. 11, 1988

[54] APPARATUS FOR PERFORMING A PLASMA ENHANCED CHEMICAL VAPOR DEPOSITION ON AN EDGE OF A POLYCARBONATE SHEET

[75] Inventor: Herman F. Nied, Clifton Park, N.Y.

[73] Assignee: General Electric Company, Schenectady, N.Y.

[21] Appl. No.: 42,774

[22] Filed: Apr. 27, 1987

[51] Int. Cl.⁴ .............................................. C23C 16/00
[52] U.S. Cl. ..................................... 118/720; 118/723
[58] Field of Search ................................ 118/720, 723

[56] References Cited

U.S. PATENT DOCUMENTS

| | | | |
|---|---|---|---|
| 3,713,869 | 1/1973 | Geffcken et al. | 204/165 |
| 4,096,315 | 6/1978 | Kubacki | 428/412 |
| 4,200,681 | 4/1980 | Hall et al. | 428/412 |
| 4,210,699 | 7/1980 | Schroeter et al. | 427/160 |
| 4,328,646 | 5/1982 | Kaganowicz | 51/281 R |

*Primary Examiner*—Bernard Pianalto
*Attorney, Agent, or Firm*—William H. Steinberg; James C. Davis, Jr.; Paul R. Webb, II

[57] ABSTRACT

Apparatus for performing a plasma enhanced chemical vapor deposition on an edge of a polycarbonate sheet includes a conduit having an axially disposed slit therethrough for engaging the sheet so as to position the edge in the conduit. Axially disposed electrodes are attached to the conduit and positioned to be on generally opposite sides of the edge. Means are provided for applying a separate electrical potential to each of the electrodes, and at least one aperture is provided in the conduit for introducing and removing a gas therefrom.

12 Claims, 2 Drawing Sheets

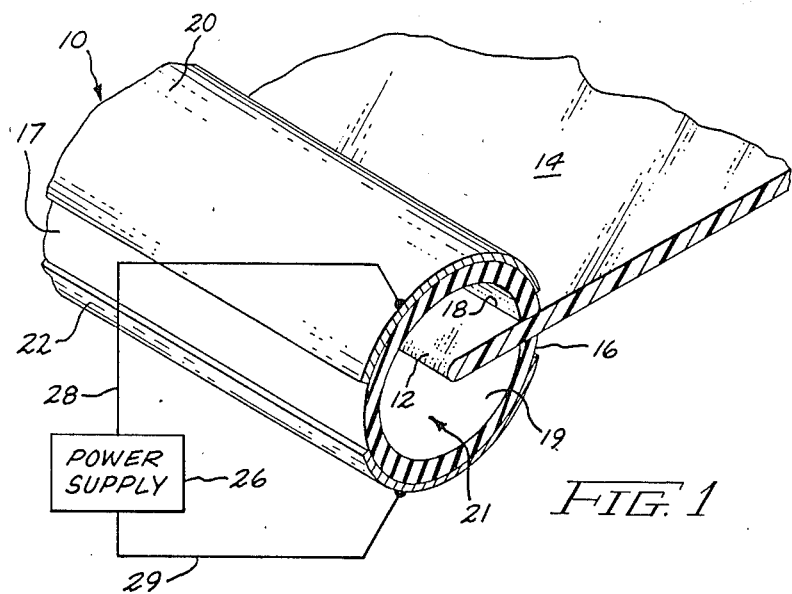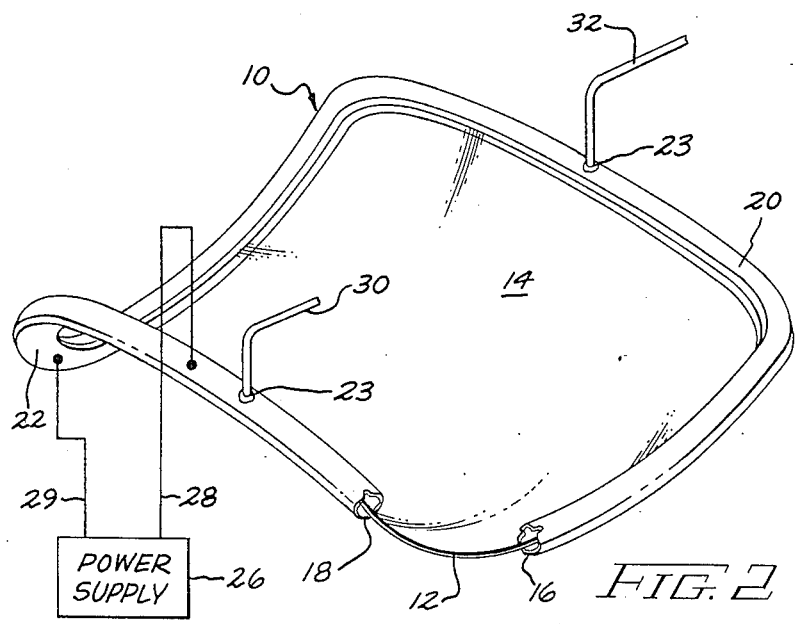

APPARATUS FOR PERFORMING A PLASMA ENHANCED CHEMICAL VAPOR DEPOSITION ON AN EDGE OF A POLYCARBONATE SHEET

This patent application is related to patent application Ser. No. 034,890, filed Apr. 6, 1987 and entitled "A METHOD FOR FORMING ABRASION RESISTANT POLYCARBONATE ARTICLES, AND ARTICLES OF MANUFACTURE PRODUCED THEREBY" which is assigned to the same assignee as the present application.

This invention relates in general to apparatus for performing a chemical vapor deposition and more specifically to apparatus for performing a plasma enhanced chemical vapor deposition on the edge of a polycarbonate sheet or substrate.

Polycarbonate resins are well-known, commercially available materials possessing physical and chemical properties which are useful in a wide variety of applications. Because of their excellent breakage resistance, polycarbonates have replaced glass in many products, such as automobile headlamps and stoplight lenses; safety shields in windows, architectural glazing, and the like. However, a major defect exhibited by polycarbonates is their very low scratch-resistance and susceptibility to ultraviolet light-induced degradation.

Methods for improving the scratch-resistance of thermoplastics, such as polycarbonate, have involved disposing an inorganic protective layer on the surface of the polycarbonate. For example, in U.S. Pat. No. 4,328,646, issued to Kaganowicz, an abrasion-resistant article is formed by subjecting a mixture of hard coating precursors to a glow discharge, and depositing the product directly on a plastic substrate as a very thin film. However, the absence of an intermediate layer between the substrate and the hard coating layer often results in surface cracking when the article is exposed to various heating/cooling cycles.

U.S. Pat. No. 4,200,681, issued to Hall et al., discloses the vapor deposition of a top layer of glass ($SiO_2$) onto an intermediate primer layer which in turn has been deposited on the surface of a polycarbonate substrate. However, the evaporative technique of applying a layer of $SiO_2$ is often undesirable for several reasons. For example, the individual particles of $SiO_2$ may evaporate and later condense on the coating surface at rates which vary with the particular site of deposition, resulting in a non-uniform glass surface often characterized by pits, pinholes, and other imperfections. Furthermore, this technique generally permits only line-of-sight deposition, and curved or indented surfaces would thus exhibit undesirable variations in glass coating thickness. Moreover, evaporative deposition methods like those of Hall et al. do not generate reactive film-forming species which can react with the underlying surface to form a very adherent coating. These methods also require extremely low operating pressure which are sometimes difficult to maintain during deposition, and cause undesirable outgassing of the polycarbonate.

U.S. Pat. No. 3,713,869, issued to Geffcken et al., teaches the deposition of an intermediate layer polymerized by glow discharge onto a polycarbonate surface. A hard inorganic layer is then vaporized by an electron beam gun onto the intermediate layer in a manner similar to that used by Hall et al., and having the same deficiencies discussed above.

There is thus a continuing interest in an improved abrasion-resistant polycarbonate sheet or substrate having disposed thereover a top layer or hardcoat characterized by uniform thickness, high abrasion resistance, and freedom from pinholes and microcracks.

Plasma enhanced chemical vapor deposition (PECVD) is a generic term commonly used to described a variety of processes for applying selected coatings to specific materials. Such processes find application in the fabrication of top coatings or hardcoats to polymer sheets. PECVD processes generally share in common the use of electrodes to create an electrical potential through a low pressure environment. The material to be coated is placed in the potential field, and a gas is subsequently passed through the field and adjacent the material to develop the coating. The strength and direction of the potential field, as well as the environmental temperature and pressure represent just several of the application dependent variables which are controlled to perform the process.

While many types of reactors are known in the art for performing PECVD on the surfaces of sheet materials, no apparatus is known to the inventor which is particularly suited for performing the process on a sheet edge. Because a precise orientation between the electrodes and materials is required to efficiently perform a PECVD process, the process is particularly difficult to perform on an edge, and more difficult to perform if the edge is curved.

OBJECTS OF THE INVENTION

A principal object of the present invention is to provide a new and improved apparatus for performing a plasma enhanced chemical vapor deposition on the edge of a polycarbonate sheet or substrate.

A further object of the present invention is to provide an apparatus for performing a plasma enhanced chemical vapor deposition on the edge of a polycarbonate sheet which automatically and precisely orients a pair of electrodes with respect to the edge.

Another object of the present invention is to provide an apparatus for performing a plasma enhanced chemical vapor deposition on the edge of a polycarbonate sheet which directs a gas adjacent the material edge.

Yet another object of the present invention is to provide an apparatus for performing a plasma enhanced chemical vapor deposition on the edge of a polycarbonate sheet which is easily used with sheets of arbitrary curvature.

Another object of the present invention is to provide an apparatus for performing a plasma enhanced chemical vapor deposition on the edge of a polycarbonate sheet which is inexpensive to construct and reliable in its operation.

SUMMARY OF THE INVENTION

A new and improved apparatus for performing plasma enhanced chemical vapor deposition on the edge of a polycarbonate article includes a conduit having a slit for engaging the sheet and positioning the sheet edge therein. The conduit further includes at least one aperture for introducing and removing a gas therefrom. A pair of separate electrodes are attached to the conduit and positioned to be on generally opposite sides of the sheet edge. Means are provided for applying a separate electrical potential to each of the electrodes. In a preferred embodiment of the invention, each electrode comprises a strip of metal foil with the slit and the electrodes being disposed axially on the conduit.

In operation, the apparatus is positioned in a low pressure vessel and an electric potential is created between the two electrodes on the conduit while gas is passed through the conduit via the aperture. The conduit functions both to direct the gas adjacent the sheet edge, and to position the electrodes in a predetermined orientation with respect to the sheet edge.

PECVD as employed herein involves situating the apparatus and associated sheet substrate in a low pressure reactor chamber; and then passing at least one gaseous reactant capable of forming the desired layer into the chamber and through the apparatus in a laminar flow relative to the coating surface of the sheet at a suitable pressure, and generating an electric field to form a plasma with the reactants. The gaseous reactants react in the plasma and on the coating surface to form the desired layer. It is to be understood that "surface", "coating surface" or "deposition surface" as used herein refers to the substrate surface or primer surface when an interfacial layer is being applied, and refers to the interfacial layer surface when the top layer is being applied, unless otherwise indicated.

Use of the PECVD method results in polycarbonate articles having all of the typical attributes of polycarbonates, such as high tensile and impact strength, while also exhibiting excellent abrasion resistance. Furthermore, a high level of adhesion results between the abrasion-resistant top layer and the polycarbonate sheet or substrate because of the presence of an interfacial layer therebetween. Moreover, unlike conventional vapor deposition processes which require high operating temperatures often damaging to polycarbonate material, PECVD can be carried out as described herein at temperatures which are harmless to polycarbonate.

BRIEF DESCRIPTION OF THE DRAWINGS

FIG. 1 shows a perspective view, partly in section, of a first embodiment of the invention;

FIG. 2 shows a perspective view, partly in section, of the conduit of FIG. 1 disposed on an outer edge of a curved polycarbonate sheet;

DETAILED DESCRIPTION OF THE INVENTION

Figure 3:
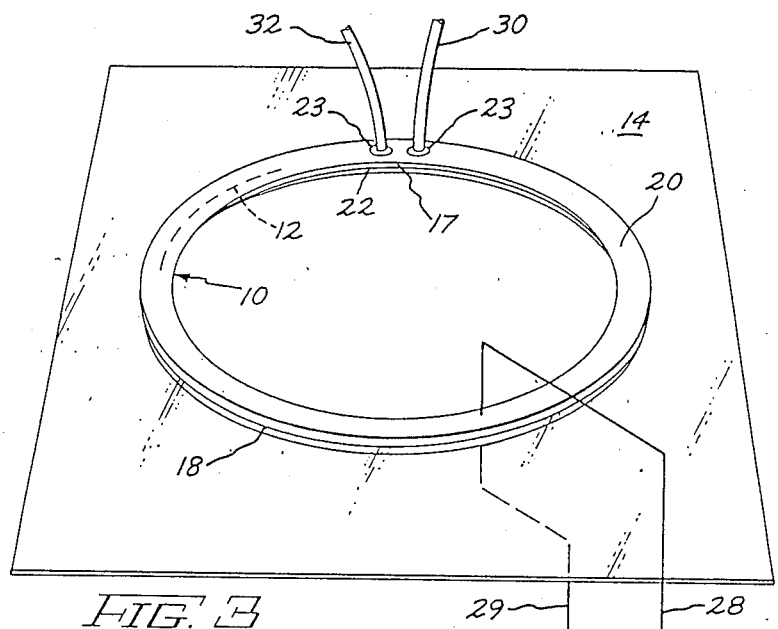
FIG. 3 shows a perspective view of the conduit of FIG. 1 disposed on an edge of a cut-out in a polycarbonate sheet.

Referring now to FIG. 1, an apparatus 10 is shown for performing a plasma enhanced chemical vapor deposition (PECVD) on an edge 12 of a polycarbonate sheet 14. Edge 12 is illustrated as being flat or convex variously throughout the Figures, the shape being determined by the cut of polycarbonate sheet 14. The typical thickness of deposited layers as described hereinbelow is typically measured in microns and are thus too thin to be illustrated in the drawings. Apparatus 10 includes a conduit 16 having outer and inner surfaces 17 and 19, respectively, an axially disposed slit 18 therethrough, and at least one aperture 21. First and second separate electrodes 20 and 22 are situated axially on outer surface 17 of conduit 16 so as to be disposed on generally opposite sides of sheet edge 12. A power supply, shown schematically at 26, is used to apply an electrical potential between electrodes 20 and 22 via a pair of electrical leads 28 and 29, respectively. Power supply 26 comprises a D.C. or a high frequency A.C. supply, depending on the specific PECVD process used. Conduit 16 is shown engaged with polycarbonate sheet 14 via slit 18 for positioning edge 12 inside the conduit.

In applications where polycarbonate sheet 14 is of known shape and thickness, conduit 16 preferably comprises a substantially rigid material such as a plastic, for example ULTEM polyetherimide resin (ULTEM being a registered trademark of the General Electric Company). In these applications, slit 18 is of a predetermined shape and size selected to engage material sheet 14 in a snug, but not necessarily air-tight fit. In applications where the shape and thickness of material sheet 14 arbitrarily varies, conduit 16 preferably comprises a flexible material such as rubber or silicone plastic. In these latter applications, slit 18 comprises an axial cut through conduit 16. In either application, electrodes 20 and 22 each preferably comprises a metal foil such as copper.

Polycarbonate materials suitable for forming a substrate are well known in the art and are described, for example, in U.S. Pat. Nos. 4,200,681 and 4,210,699, both incorporated herein by reference. The polycarbonate substrate may be shaped into a variety of forms, depending on the end use contemplated for the article. For example, a polycarbonate film substrate may be formed by casting the molten polymer onto a flat open mold, and then pressing the material to a uniform thickness. When the sheet is to be used as a glazing material, the polycarbonate material may be formed into flat or curved sheets by well-known methods, e.g., extrusion or injection molding.

An interfacial layer is applied over the surface of the polycarbonate substrate by PECVD. The interfacial layer may also be applied over the surface of the substrate by conventional methods well known in the art, e.g., spraying, roll coating, curtain coating, dip coating, and brushing. "Interfacial layer" as used herein is meant to define a layer of an adherent resinous composition disposed between the top layer or hardcoat and the substrate. The surface of the interfacial layer will be in contact with the subsequently-applied top layer. The opposite surface of the interfacial layer may or may not in contract with the facing surface of the substrate. Depending on the presence of absence of a primer on the substrate surface.

The composition of the interfacial layer of the present invention will depend on both the end use contemplated for the article or coated sheet and the manner in which the interfacial layer is applied over the polycarbonate substrate.

One of the important functions of the interfacial layer is to act as an incorporation site for one or more ultraviolet light (UV) absorbers. By concentrating the absorbers in the relatively thin interfacial layer, the underlying polycarbonate is more efficiently protected from UV light than in those instances in which the absorbers are dispersed throughout the polycarbonate itself.

Organosilicons are particularly useful materials for forming the interfacial layer. "Organosilicon" as used herein is meant to embrace organic compounds in which at least one silicon atom is bonded to at least one carbon atom, and includes silicon materials, as well as materials commonly referred to as silanes, siloxanes, silazanes, and organosilicons. Suitable organosilicons for the interfacial layer are described in *Organosilicon*

*Compounds.* C. Eaborn, Butterworths Scientific Publications, 1960.

Preferred organosilicon compounds for the present invention when the interfacial layer is to be PECVD-applied are hexamethyldisilazane, hexamethyldisiloxane, vinyltrimethylsilane and octamethylcyclotetrasiloxane. The monomer vapor of these compounds is polymerized in the plasma to form the interfacial layer.

In operation, apparatus 10 is engaged manually by the operator or automatically with polycarbonate sheet 14 by positioning edge 12 within slit 18 and centrally within conduit 16 to thereby position electrodes 20 and 22 on generally opposite sides of the edge. In the applications where polycarbonate sheet 14 is of known shape and thickness, the sheet is held in the correct engagement with the conduit 16. In the applications where sheet 14 is of arbitrary thickness and curvature, the flexible conduit 16 is bent manually or automatically to match the curve of edge 14 and is essentially clipped to the material sheet by slit 18. Power supply 26 is used to establish an electrical potential between electrodes 20 and 22. Gases (not shown) are introduced separately and sequentially through axially disposed aperture 21 in apparatus 10 to circulate separately within conduit 16. Each gas is subsequently removed through one or more of the same or separate apertures 21.

The operation of PECVD in apparatus 10 applies to both the deposition of the interfacial layer and the top layer. When a discharge is produced at low pressure in the film-forming gaseous reactants, the reactants become ionized, forming a plasma. A portion of the material is in the form of ions, electrons, and atomic-free radicals generated in the plasma prior to formation of the film over or upon the substrate. Most of the reactive species consist of the atomic-free radicals. It is thought that at the higher plasma frequencies, e.g., 13.56 mHz, most of the film formation on or over the substrate occurs when the free radical species diffuse out of the plasma to the deposition surface. Thus, free radicals react on or over the primed or unprimed substrate (or on or over the interfacial layer surface) to form the desired layer. A distinct advantage of PECVD over conventional chemical vapor deposition processes lies in the fact that the applied electric field enhances free radical formation, thereby permitting the use of deposition temperatures which are low enough to prevent damage to polycarbonate substrates, i.e., temperatures less than about 130° C. Furthermore, when used under the process conditions disclosed herein, PECVD can be carried out with a much higher percentage of free radicals than is possible with conventional CVD.

When the interfacial layer or top layer is to be applied by PECVD, the edge 12 of primed or unprimed polycarbonate substrate is placed within apparatus 10 in which an electric field can be generated. Apparatus 10 is positioned within a low pressure reactor (not shown) and both apparatus and reactor must be capable of being substantially evacuated, i.e., to a pressure of less than or equal to about 1.0 millitorr. Electrodes 20 and 22 are on generally opposite sides of edge 12. The spacing between the electrodes depends on he desired strength of the applied electric field, as well as the size of the article being coated. Those skilled in the vapor deposition art appreciate the interrelationship of these processing variables and are therefore able to make adjustments for a particular use of this invention without undue experimentation.

Film-forming materials must be in vapor or gaseous form for the PECVD process. Vapor reactants, such as acrylic or organosilicon monomers, are vaporized from the liquid form prior to entry into the reactor chamber and apparatus.

The liquid material may be degassed by cooling it and then subjecting it to a vacuum. Depending on its particular boiling point, the liquid is then heated to ambient temperature or higher in order to provide sufficient positive vapor pressure to flow into the low pressure reactor and through conduit 16.

The reactor and apparatus positioned therein are evacuated prior to entry of the gaseous reactants. Reactor and apparatus pressures as required for the process range from about 50 millitorrs to about 10 torrs, with a preferred pressure of about 0.3 torr to about 0.6 torr when applying an interfacial layer, and about 1.0 torr when applying a top layer.

The gaseous reactants which form the compositions of the coatings of the present invention may be supplied from an external source through a series of inlet pipes into the chamber of the low pressure reactor. The technical particularities of channeling the various gases into the reactor chamber are well-known in the art and need not be described in detail here.

Excessive flow rates of the gaseous reactant would force the active, film-forming reactants past the zone above the deposition surface before they react to form the coating on the surface. Conversely, if the flow rate is too small, the film-forming reactants will quickly be depleted and thereby lead to nonuniformities in film thickness. The flow rate of interfacial layer reactants such as acrylic or organosilicon monomers may range from about 5 sccm to about 250 sccm, with about 20 sccm to about 100 sccm being preferred. For coating surfaces larger than about 10 square feet, higher flow rates of reactants forming the abrasion-resistant top layer ranges from about 500 sccm to about 10,000 sccm for each reactant when a carrier gas is used, and from about 50 sccm to about 50 sccm without a carrier gas. Those skilled in the art will be able to easily select a proper flow rate for a particular coating material if the teachings herein are followed.

Laminar flow of the gaseous reactants in the conduit of the present apparatus relative to the deposition surface is of great importance because it enhances the uniformity of the coating in terms of thickness and properties such as hardness, clarity, and, for the interfacial layer, adhesive and thermal expansion compensation capabilities.

"Laminar flow" as used herein is defined as smooth and steady flow, i.e., a substantially streamlined flow of gaseous reactants relative to the substrate and characterized by the absence of turbulent flow of reactant molecules. This type of gas flow is described, for example, in *Fluid Mechanics,* by F. White, McGraw-Hill Book Company, 1979, p. 305 et seq., the disclosure of which is incorporated herein by reference.

The coating surface is preferably heated to a temperature between about 100° C. and 130° C. during plasma deposition, 100° C. being the preferred temperature. The heating can be accomplished by a variety of well-known methods. It should also be understood that deposition onto a coating surface maintained at between about room temperature and 100° C. is also within the scope of the PECVD process.

The primer surface and the interfacial layer surface may be etched after they are placed in the reaction chamber. Etching techniques are well-known in the art.

As the reactants enter the conduit, an electric field is generated under preselected frequency and power conditions to ionize the gas mix, thereby forming a plasma. Methods of generating an electric field between electrodes are well-known in the art and therefore do not require an exhaustive description here. A dc field, or an ac field from 50 Hz to about 10 GHz, may be used. Power values range from between about 10 watts to 5000 watts. A particularly suitable electrical field-generating means for this process is the use of a high frequency power supply to initiate and sustain the plasma. When such as power supply is used, a preferred operating frequency is 13.56 MHz, as described, for example, in R. Kubacki's U.S. Pat. No. 4,096,315, incorporated herein by reference. The particular frequency and power values utilized will depend in part on the particular deposition requirement for the coating material.

After passing over the coating surface, the carrier gas and any gas reactants or products which have not been deposited on the substrate surface may be directed out of the conduit through the same or separate apertures and then to an exit valve and to a gas pumping and exhaust system. Furthermore, after the application of the plasma-deposited layer, residual gases may be removed from the conduit and reactor chamber by pumping.

The thickness of the interfacial layer is in part determined by the contemplated end use of the article, and generally may range from about 0.1 micron to about 6.0 microns, regardless of how it is applied. When the interfacial layer is a conventionally-applied organosilicon material containing colloidal silica dispersed therein, a preferred thickness range is from about 2.0 microns to about 6.0 microns.

After the interfacial layer has been applied over the surface of the substrate, the abrasion-resistant top layer is applied on the interfacial layer by the PECVD method generally described above. Nonlimiting examples of suitable abrasion-resistant materials include silicon dioxide, silicon nitride, silicon oxynitride, silicon carbide, silicon carbon nitride, boron oxide, boron nitride, aluminum oxide, aluminum nitride, titanium dioxide, tantalum oxide, iron oxide, germanium oxide, and germanium carbide. When the article is to be used as a glazing material, a silicon dioxide top layer is preferred because of its ease of plasma deposition and the relatively inexpensive cost of its precursors.

Gaseous reactants capable of combining to form the composition of a particular top layer are passed into the PECVD reactor chamber described above. Those skilled in the chemical arts are familiar with a variety of reactants which may be combined to form the top layer of the present invention. For example, silicon dioxide may be formed by the reaction of silane with nitrous oxide; by the reaction of silicon tetrachloride with oxygen; or by the reaction of tetraethoxy silane with oxygen.

As in the case of organosilicon-type deposition, the processing variables for depositing the top layer depend upon the particular top layer utilized, the desired coating thickness, and the desired surface appearance. Flow rates of gaseous reactants forming the top layer range from about 50 sccm to about 10,000 sccm as discussed above. Internal pressure for the reactor chamber during PECVD of the top layer ranges from about 50 millitorrs to about 10 torrs, while dc or ac fields can be used. The ac field can range from about 50 MZ to about 10 GHz, and the power output ranges from about 10 watts to about 5000 watts. Those skilled in the art appreciate that adjustment of each of the above processing parameters may be made according to the particular coating being applied. Mid-range chamber pressures, lower power output, and higher frequencies within the above-described ranges are generally preferred when a silicon dioxide coating is being applied to a substrate coated with an organosilicon interfacial layer. For example, high quality, uniform silicon dioxide coatings from silane and nitrous oxide may be formed on a PECVD-coated or conventionally-coated organosilicon interfacial surface at a deposition rate of about 500 Angstroms per minute when the silane flow rate (2% in He) is about 2500 sccm, the $N_2O$ flow rate is about 1625 sccm, the frequency is about 13.56 MHz, the reactor chamber pressure is about 1 torr, the power value is about 50 watts, and the substrate is heated to a temperature of about 100° C. In general, though, the thickness of top layers applied by the PECVD method used in the present apparatus may range from about 0.025 micron to about 10.0 microns.

Referring now to FIGS. 2 and 3, FIG. 2 shows apparatus 10 applied to outer edge 12 of a curved material sheet 14. The lower right edge of apparatus 10 (as viewed in FIG. 2) is shown cut away to better illustrate its placement with respect to edge 12 of material sheet 14. FIG. 3 shows apparatus 10 applied to an inner edge 12 of a circular aperture in material sheet 14. Apparatus 10 is fit on the circular aperture by bending a flexible conduit 16 such that slit 18 is on the outer periphery thereof, and clipping the slit over edge 12 in the manner described hereinabove. FIGS. 2 and 3 each show tubes 30 and 32 connected at separate radially disposed apertures 23 in conduit 16 for introducing gas into and removing gas from the conduit, respectively. It will be appreciated by those skilled in the art that the exact placement and use of inlet and outlet apertures is largely a process dependant decision.

Figure 4:
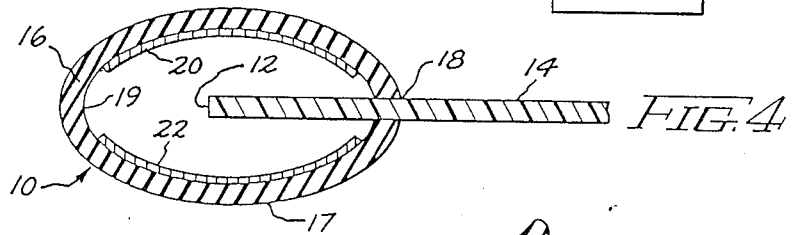
FIG. 4 shows a cross-sectional side view of a second embodiment of the invention.
Figure 5:
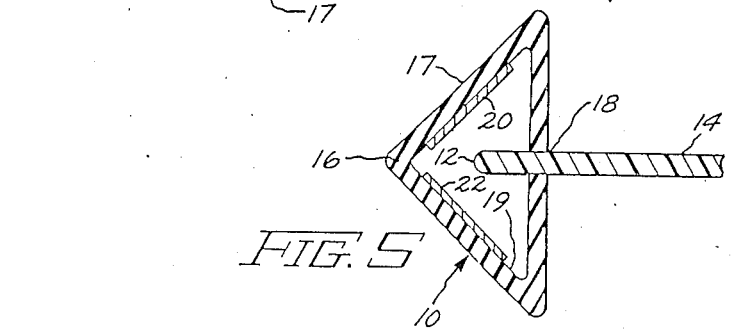
FIG. 5 shows a cross-sectional side view of a third embodiment of the invention.

FIGS. 4 and 5 show alternate cross-sectional shapes for conduit 16. In FIG. 4, conduit 16 has a generally elliptical cross-sectional shape, with electrodes 20 and 22 being disposed on inner surface 19 thereof. In FIG. 5 conduit 16 is generally triangular in cross-sectional shape, with electrodes 20 and 22 being disposed on inner surface 19 thereof. It will be appreciated by those skilled in the art that the shape of conduit 16 is selected to control the desired shape of the deposition on edge 12. It will be further appreciated that electrodes 20 and 22 may be selectively positioned on outer surface 17 or on inner surface 19 of conduit 16, depending on applicational factors such as the desired strength of the electrical field and the corrosive characteristics of the gas used in the PECVD process.

There is thus provided an apparatus for performing a plasma enhanced chemical vapor deposition on the edge of a polycarbonate sheet which is straightforward in construction and which functions both to precisely orient the electrodes with respect to the edge and to direct a gas adjacent the edge. This apparatus is of particular benefit when the polycarbonate sheet is of arbitrary or preselected curvature.

While preferred embodiments of the invention have been illustrated and described, it will be clear that the invention is not so limited. Numerous modification, changes, variations, substitutions and equivalents will occur to those skilled in the art without departing from the spirit and scope of the present invention. Accordingly, it is intended that the invention herein be limited only by the scope of the appended claims.

What is claimed is:

1. Apparatus for performing plasma enhanced chemical vapor deposition on the edge of a polycarbonate sheet comprising:
    a conduit having an axial slit for engaging the sheet of polycarbonate and positioning said sheet edge inside of said conduit;
    a pair of separate electrodes are attached to said conduit and positioned to be disposed on generally opposite sides said polycarbonate sheet edge;
    means for applying a separate electrical potential to each of the electrodes; and
    said conduit defining at least one aperture for introducing and removing a gas therefrom.

2. The apparatus of claim 1 wherein each of said electrodes comprises a strip of metal foil disposed axially on said conduit.

3. The apparatus of claim 2 wherein said potential applying means includes at least on separate electrical conductor disposed in contact with each of said electrodes.

4. The apparatus of claim 2 wherein said electrodes are disposed on the inner surface of said conduit.

5. The apparatus of claim 2 wherein said electrodes are disposed on the outer surface of said conduit.

6. The apparatus of claim 2 wherein said conduit has a generally circular cross-sectional shape.

7. The apparatus of claim 2 wherein said conduit has a generally rectangular cross-sectional shape.

8. The apparatus of claim 2 wherein said conduit has a generally elliptical cross-sectional shape.

9. The apparatus of claim 2 wherein said conduit comprises a flexible material.

10. The apparatus of claim 9 wherein said conduit comprises rubber or silicon plastic.

11. The apparatus of claim 2 wherein said conduit comprises a substantially rigid material.

12. The apparatus of claim 11 wherein said conduit comprises a plastic.

* * * * *